(12) United States Patent
Lin et al.

(10) Patent No.: US 11,776,648 B2
(45) Date of Patent: Oct. 3, 2023

(54) CIRCUIT FOR TESTING MEMORY

(71) Applicant: REALTEK SEMICONDUCTOR CORPORATION, Hsinchu (TW)

(72) Inventors: Sheng-Lin Lin, Hsinchu (TW); Chun-Yi Kuo, Hsinchu (TW); Shih-Chieh Lin, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/539,216

(22) Filed: Dec. 1, 2021

(65) Prior Publication Data

US 2022/0180956 A1 Jun. 9, 2022

(30) Foreign Application Priority Data

Dec. 8, 2020 (TW) ................. 109143281

(51) Int. Cl.
*G11C 29/32* (2006.01)
*G11C 29/12* (2006.01)
*G11C 29/38* (2006.01)

(52) U.S. Cl.
CPC .......... *G11C 29/32* (2013.01); *G11C 29/1201* (2013.01); *G11C 29/38* (2013.01)

(58) Field of Classification Search
CPC . G11C 29/34; G11C 2029/3202; G11C 29/38; G11C 29/1201; G11C 29/32; G01R 31/318536; G01R 31/318541; G01R 31/318533
See application file for complete search history.

(56) References Cited

U.S. PATENT DOCUMENTS

| | | | | |
|---|---|---|---|---|
| 5,592,493 A | * | 1/1997 | Crouch | G01R 31/318536 714/724 |
| 7,487,419 B2 | * | 2/2009 | Mukherjee | G01R 31/318541 714/724 |
| 9,310,436 B2 | | 4/2016 | Picalausa et al. | |
| 2004/0190331 A1 | * | 9/2004 | Ross | G11C 29/48 365/154 |
| 2015/0325314 A1 | * | 11/2015 | Ziaja | G11C 7/1078 365/189.12 |

(Continued)

FOREIGN PATENT DOCUMENTS

TW I550399 9/2016

OTHER PUBLICATIONS

V. R. Devanathan and S. Vooka, "Techniques to improve memory interface test quality for complex SoCs," in Proc. International Test Conference, 2011, pp. 1-10.

(Continued)

*Primary Examiner* — Steve N Nguyen
(74) *Attorney, Agent, or Firm* — WPAT. P.C

(57) ABSTRACT

A test circuit for testing a memory is provided. The input of the memory is coupled to a register, and the register is coupled to a logic circuit. The test circuit includes a first test register group, a second test register group, a first multiplexer, and multiple second multiplexers. The first test register group includes at least one test register. The second test register group includes at least one test register. The first multiplexer is coupled between the first test register group and the register. The second multiplexers are coupled between the second test register group and the register.

6 Claims, 9 Drawing Sheets

(56) References Cited

U.S. PATENT DOCUMENTS

2021/0383885 A1* 12/2021 Chien ................ H01L 25/0657

OTHER PUBLICATIONS

OA letter of the counterpart TW application (appl. No. 109143281) dated Dec. 28, 2021. Summary of the OA letter: (1) Claim(s) 1, 3, 4, 8 and 9 is/are rejected under Patent Law Article 22(1) as being anticipated by reference 1 (TW I550399). (2) Claim(s) 2 and 5 is/are rejected under Patent Law Article 22(2) as being unpatentable over reference 1 (TW I550399). Claim corresponding between the TW counterpart application adn the instant US application: Claims 1-10 in the TW counterpart application correspind to claims, 1, 2, 3, 7, 8, 9, 11, 12, 16 and 18 in the instant US application, respectively.

* cited by examiner

CIRCUIT FOR TESTING MEMORY

BACKGROUND OF THE INVENTION

1. Field of the Invention

The present invention generally relates to memories, and, more particularly, to memory testing.

2. Description of Related Art

A chip with a specific function (such as a system-on-a-chip (SoC)) usually contains logic circuits, function registers, and a memory. The function registers are the registers used in the normal operation of the chip (e.g., when the chip performs the specific function). The tests prior to the delivery of the chip generally include a scan test and a memory built-in self-test (MBIST), both of which, however, fail to test the delay fault and the stuck-at fault on the paths between the function registers and the memory. In the testing of these two faults, the prior art technology uses the random access memory (RAM) sequential automatic test pattern generation (ATPG) tool to generate test vectors, and then performs read and write operations on the memory for multiple periods using the test vectors through the scan chain. However, when there are a great number of logic circuits on the scan chain, the calculation complexity of the generation of multiple periods of test vectors by the ATPG is increased, making it harder for the ATPG to control the memory, which in turn gives rise to the issues of long-time generation of test vectors, a large number of test vectors, and low test coverage.

SUMMARY OF THE INVENTION

In view of the issues of the prior art, an object of the present invention is to provide a memory test circuit, so as to make an improvement to the prior art.

According to one aspect of the present invention, a test circuit for testing a memory is provided. The input of the memory is coupled to a register, and the register is coupled to a logic circuit. The test circuit includes a first test register group, a second test register group, a first multiplexer, and multiple second multiplexers. The first test register group includes at least one test register. The second test register group includes at least one test register. The first multiplexer is coupled between the first test register group and the register. The second multiplexers are coupled between the second test register group and the register.

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be interpreted accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes circuits for testing memories. On account of that some or all elements of the circuits for testing memories could be known, the detail of such elements is omitted provided that such detail has little to do with the features of this disclosure, and that this omission nowhere dissatisfies the specification and enablement requirements. A person having ordinary skill in the art can choose components or steps equivalent to those described in this specification to carry out the present invention, which means that the scope of this invention is not limited to the embodiments in the specification.

Figure 1:
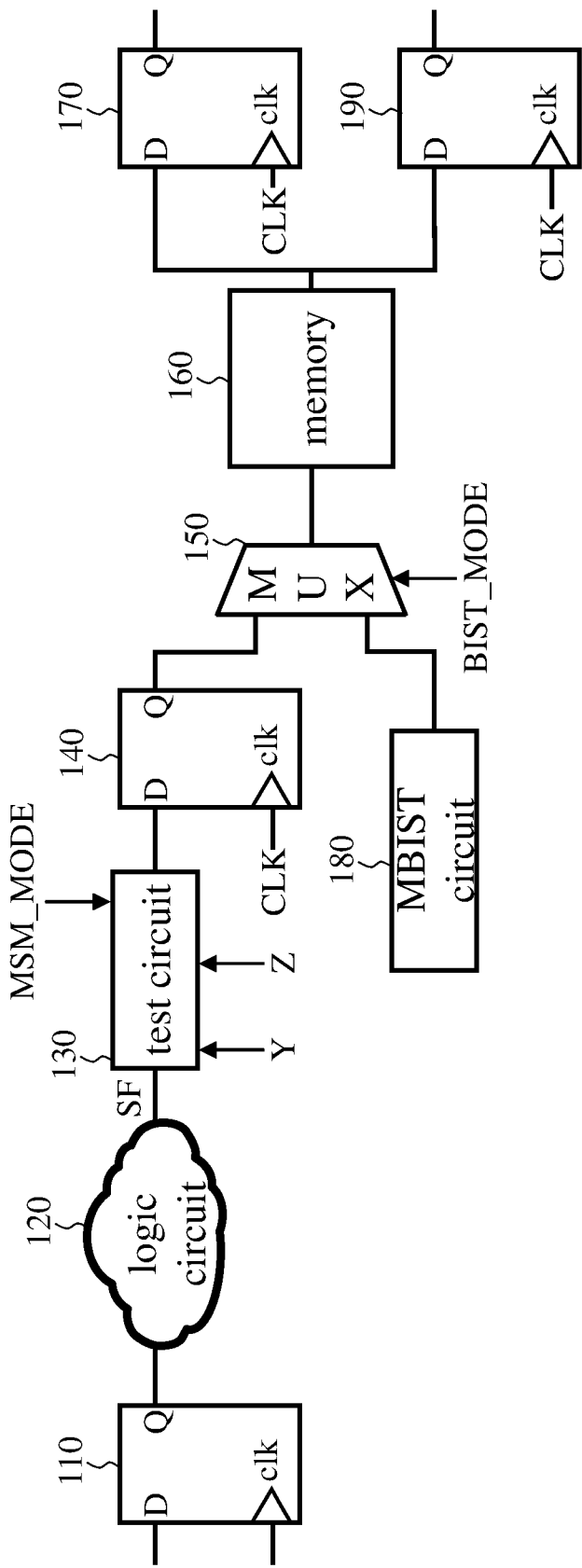
FIG. 1 illustrates the test circuit of the present invention, the memory, the logic circuit, the function registers, the MBIST circuit, and the MBIST register in a chip.

FIG. 1 shows the test circuit of the present invention, the memory, the logic circuit, the function registers, the MBIST circuit, and the MBIST register in a chip. The register 110, the register 140, and the register 170 are function registers, and the register 190 is the MBIST register. The test circuit 130 is coupled between the logic circuit 120 and the register 140 as well as coupled to the memory 160 through the register 140 and the multiplexer (MUX) 150. The input terminal of the register 110 and the output terminal of the register 170 are coupled to other logic circuits or function registers (not shown) in the chip. In this disclosure, the register is embodied by a scan D flip-flop; this is intended to illustrate the invention by way of examples, rather than to limit the scope of the claimed invention.

In the MBIST mode, a control circuit (not shown) inside or outside the chip uses the mode control signal BIST_MODE to control the multiplexer 150 to select the MBIST circuit 180 and receives the output of the memory 160 through the register 190.

In the normal operation mode of the chip, the control circuit controls the multiplexer 150 to select the register 140 instead of the MBIST circuit 180 and uses the mode control signal MSM_MODE to control the test circuit 130 to output the output of the logic circuit 120 (i.e., the function signal SF) instead of the test signals which, as will be discussed in detail below, include the write enable signal WE, the memory address ADDR, and the test data DI.

In the interface test mode, which is aimed to test the aforementioned delay faults, stuck-at faults, or other faults that are present on the paths between the memory 160 and the function registers (i.e., the register 140 and the register 170), the control circuit controls the multiplexer 150 to select the register 140 instead of the MBIST circuit 180, and controls the test circuit 130 to output the test signals instead of the function signal SF.

In some embodiments, the test circuit 130 is electrically connected to the register 140; in other words, the test circuit 130 is directly connected to the register 140 with no intervening circuits (including but not limited to logic circuits and registers) arranged therebetween.

Figure 2A:
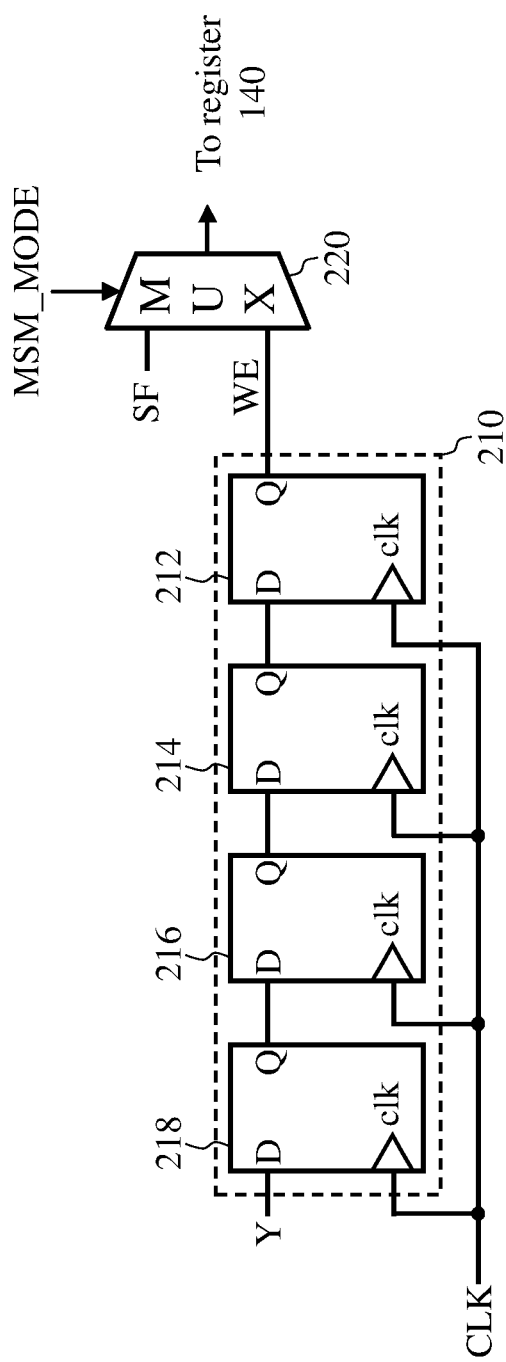
FIGS. 2A and 2B illustrate circuit diagrams of the test circuit according to an embodiment of the present invention.
Figure 2B:
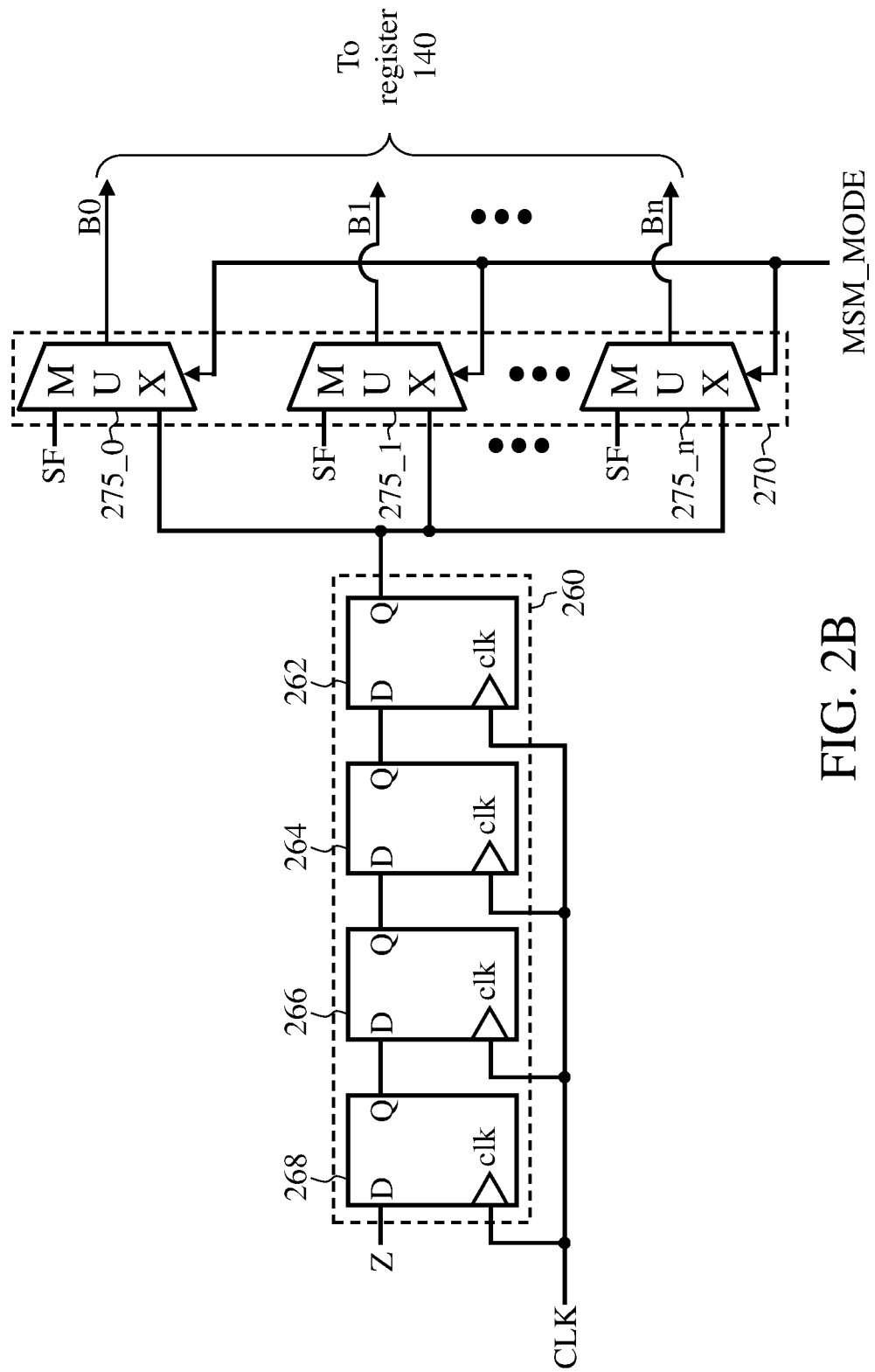

FIGS. 2A and 2B show circuit diagrams of the test circuit according to an embodiment of the present invention. The test circuit is used to test the delay fault on the paths between the memory 160 and the function registers (i.e., the register 140 and the register 170). In the embodiment of FIGS. 2A and 2B, the test circuit 130 includes a first test register group 210, a multiplexer 220, a second test register group 260, and a multiplexer group 270. The first test register group 210 includes a test register 212, a test register 214, a test register 216, and a test register 218. The second test register group 260 includes a test register 262, a test register 264, a test register 266, and a test register 268. The multiplexer group 270 includes n+1 multiplexers 275 (i.e., the multiplexer 275_0, the multiplexer 275_1, . . . , and the multiplexer 275_n, n being a positive integer).

Reference is made to FIG. 2A. The circuit in FIG. 2A is used to output the write enable signal WE. When the write enable signal WE is of the first level (e.g., high level) or the first logic (e.g., logic 1), data can be written into the memory 160; when the write enable signal WE is of the second level (e.g., low level) or second logic (e.g., logic 0), the memory 160 can be read only. The test register 212, the test register 214, the test register 216, and the test register 218 are electrically connected in sequence; that is, the input terminal D of the test register 212 is electrically connected to the output terminal Q of the test register 214, the input terminal D of the test register 214 is electrically connected to the output terminal Q of the test register 216, and the input terminal D of the test register 216 is electrically connected to the output terminal Q of the test register 218. Therefore, the bit value Y is transmitted in sequence through the four test registers. If the test register 212, the test register 214, the test register 216, and the test register 218 are rising edge-triggered registers and at a certain moment store the bit values Y1, Y2, Y3, and Y4, respectively, then the first test register group 210 will output bit values Y1, Y2, Y3, and Y4 in sequence as the write enable signal WE at the subsequent four consecutive rising edges of the clock CLK. The multiplexer 220 is coupled between the first test register group 210 and the register 140 and selects the function signal SF or the output of the first test register group 210 according to the mode control signal MSM_MODE.

Reference is made to FIG. 2B. The circuit of FIG. 2B is used to output the test data DI and/or the memory address ADDR. The test register 262, the test register 264, the test register 266, and the test register 268 are electrically connected in sequence. Therefore, the bit value Z is transmitted in sequence through the four test registers. The multiplexer group 270 is coupled between the second test register group 260 and the register 140 and selects the function signal SF or the output of the second test register group 260 according to the mode control signal MSM_MODE. When the mode control signal MSM_MODE controls the multiplexer group 270 to select the output of the second test register group 260, the bit values B0, B1, . . . , and Bn, which are the output values of the multiplexer 275_0, the multiplexer 275_1, . . . , and the multiplexer 275_n, respectively, are all identical to the output of the test register 262. In other words, the multiplexer group 270 outputs the output of the second test register group 260 to the corresponding pins (i.e., the data pins and/or address pins) of the memory 160 in a broadcasting manner.

In some embodiments, the aforementioned bit value Y and bit value Z can be generated by the aforementioned control circuit (not shown) inside or outside the chip. In other words, the test circuit 130 can be set or controlled by the control circuit. For example, in the scan test, the values of the test registers 212 to 218 and the values of the test registers 262 to 268 can be directly set to logic 1 or logic 0 through the scan chain in the load phase.

When the control circuit tests the delay fault of the memory 160, the test signals received by the memory 160 (i.e., the write enable signal WE, the test data DI, and the memory address ADDR) are shown in Table 1 below.

TABLE 1

| Period | T1 | T2 | T3 | T4 |
|---|---|---|---|---|
| Operation | Write | Write | Read | Read |
| WE | 1 | 1 | 0 | 0 |
| ADDR | first address | second address | first address | second address |
| DI | first value | second value | | |

In the period T1, the test circuit 130 outputs 1 as the write enable signal WE, outputs the first address as the memory address ADDR, and outputs the first value as the test data DI; namely, the control circuit writes the first value to the first address of the memory 160. In the period T2, the test circuit 130 outputs 1 as the write enable signal WE, outputs the second address as the memory address ADDR, and outputs the second value as the test data DI; namely, the control circuit writes the second value to the second address of the memory 160. The second address is different from the first address, and the second value is different from the first value. In the period T3, the test circuit 130 outputs 0 as the write enable signal WE and outputs the first address as the memory address ADDR; namely, the control circuit reads the data stored in the first address of the memory 160, and, in this instance, the test data DI can be any value. In the period T4, the test circuit 130 outputs 0 as the write enable signal WE and outputs the second address as the memory address ADDR; namely, the control circuit reads the data stored in the second address of the memory 160, and, in this instance, the test data DI can be any value. When there is no delay fault, the data read by the control circuit in the first and second read operations should present the first value and the second value, respectively. However, when there is a delay fault, at least one bit of the data read by the control circuit in the second read operation presents an incorrect value. The periods T1, T2, T3, and T4 are four consecutive periods of the clock CLK.

In some embodiments, the contents of the memory address ADDR and the test data DI in Table 1 above are as shown in Table 2 or Table 3 below.

TABLE 2

| Period | T1 | T2 | T3 | T4 |
|---|---|---|---|---|
| Operation | Write | Write | Read | Read |
| WE | 1 | 1 | 0 | 0 |
| ADDR | 11 . . . 11 (All 1) | 00 . . . 00 (All 0) | 11 . . . 11 (All 1) | 00 . . . 00 (All 0) |
| DI | 11 . . . 11 (All 1) | 00 . . . 00 (All 0) | | |

TABLE 3

| Period | T1 | T2 | T3 | T4 |
|---|---|---|---|---|
| Operation | Write | Write | Read | Read |
| WE | 1 | 1 | 0 | 0 |
| ADDR | 00 ... 00 (All 0) | 11 ... 11 (All 1) | 00 ... 00 (All 0) | 11 ... 11 (All 1) |
| DI | 00 ... 00 (All 0) | 11 ... 11 (All 1) | | |

In other words, the first address in Table 1 can be one of the greatest address (i.e., all bits of the memory address ADDR being 1, as in Table 2) and the smallest address (i.e., all bits of the memory address ADDR being 0, as in Table 3) of the memory 160, while the second address can be the other. The first value in Table 1 can be the greatest value of the test data DI (i.e., all bits of the test data DI being 1, as in Table 2) and the smallest value of the test data DI (i.e., all bits of the test data DI being 0, as in Table 3), while the second value can be the other. In this way, if there is no delay fault in the circuit, a transition (either from logic 1 (or high level) to logic 0 (or low level), or the opposite) of the output of the register 190 will be observed by the control circuit.

For the embodiment of Table 2 or Table 3, at a certain moment during the test period, the test register 212, the test register 214, the test register 216, and the test register 218 respectively store the bit values Y1, Y2, Y3, and Y4, of which the bit values Y1 and Y2 correspond to the write operation (e.g., Y1=Y2=1), whereas the bit values Y3 and Y4 correspond to the read operation (e.g., Y3=Y4=0).

For the embodiment of Table 2 or Table 3, at a certain moment during the test period, the test register 262, the test register 264, the test register 266, and the test register 268 store the bit values Z1, Z2, Z3, and Z4, respectively, of which the bit values Z1 and Z3 correspond to the first address and/or the first value (e.g., Z1=Z3=1 (as in Table 2) or Z1=Z3=0 (as in Table 3)), whereas the bit values Z2 and Z4 correspond to the second address and/or the second value (e.g., Z2=Z4=0 (as in Table 2) or Z2=Z4=1 (as in Table 3)). Because the first address is different from the second address and the first value is different from the second value, the bit value Z1 is different from the bit value Z2, and the bit value Z3 is different from the bit value Z4.

For the embodiment of Table 2 or Table 3, the circuit of FIG. 2B can be used to output the memory address ADDR and/or the test data DI. Specifically, the content of a set of digital codes B (i.e., B0:Bn) that the multiplexer group 270 outputs is n+1 bit values 1 or n+1 bit values 0; the memory address ADDR can be the set of digital codes B (i.e., the length of the memory address ADDR is n+1 bits) or a part of the set of digital codes B (i.e., the length of the memory address ADDR is less than n+1 bits), and/or the test data DI can be the set of digital codes B (i.e., the length of the test data DI is n+1 bits) or a part of the set of digital codes B (i.e., the length of the test data DI is less than n+1 bits).

Figure 3A:
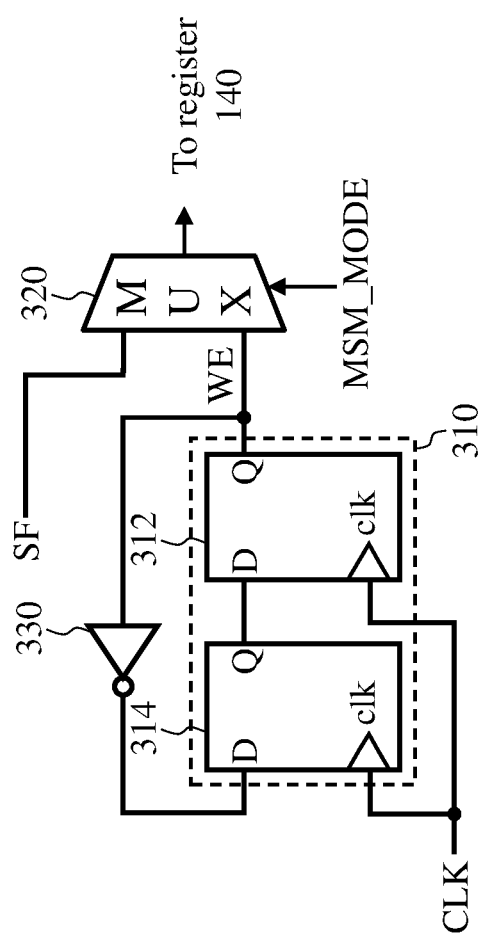
FIGS. 3A and 3B illustrate circuit diagrams of the test circuit according to another embodiment of the present invention.
Figure 3B:
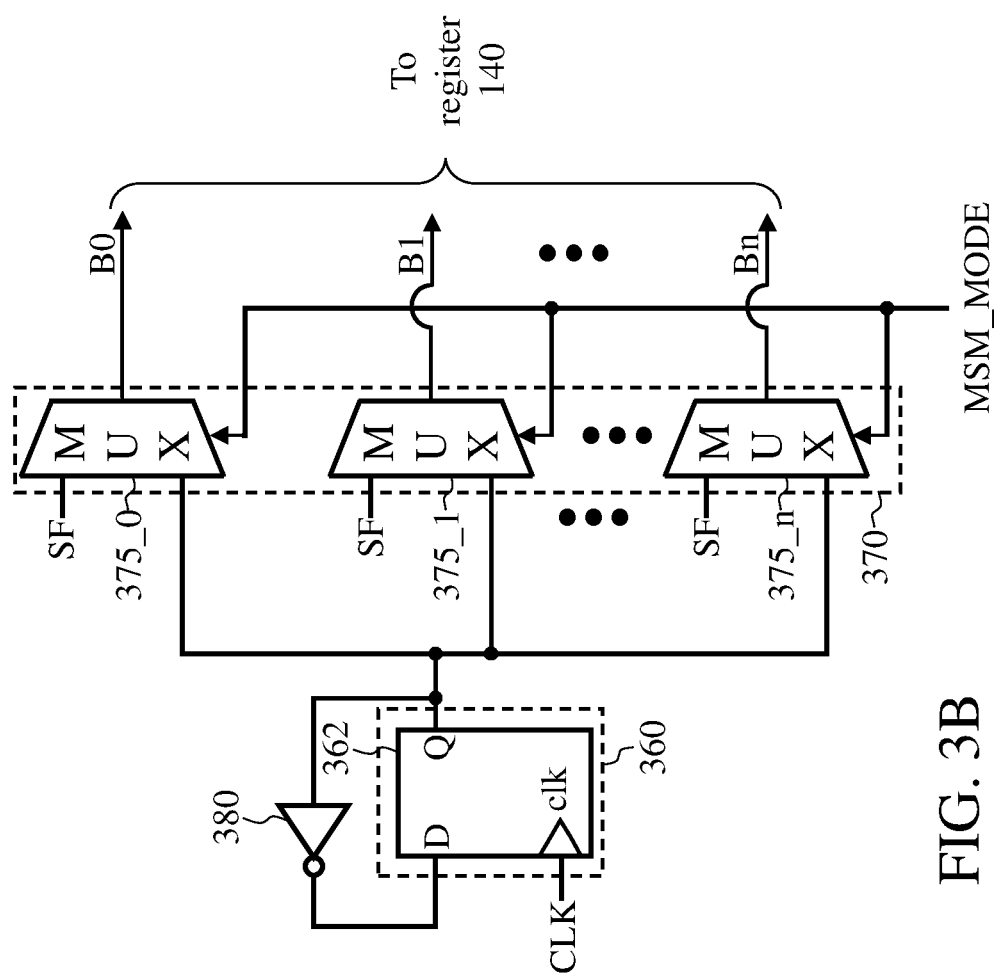

FIGS. 3A and 3B show circuit diagrams of the test circuit according to another embodiment of the present invention. The test circuit is used to test the delay fault of the memory 160. In the embodiment of FIGS. 3A and 3B, the test circuit 130 includes a first test register group 310, a multiplexer 320, an inverter 330, a second test register group 360, a multiplexer group 370, and an inverter 380. The first test register group 310 includes a test register 312 and a test register 314. The second test register group 360 includes a test register 362. The multiplexer group 370 includes n+1 multiplexers 375 (i.e., the multiplexer 375_0, the multiplexer 375_1, ..., and the multiplexer 375_n, n being a positive integer).

Reference is made to FIG. 3A. The circuit of FIG. 3A is used to output the write enable signal WE. The test register 312 is electrically connected to the test register 314. The multiplexer 320 is coupled between the first test register group 310 and the register 140 and selects the function signal SF or the output of the first test register group 310 according to the mode control signal MSM_MODE. The inverter 330 is coupled between the test register 312 and the test register 314. More specifically, the input terminal of the inverter 330 is coupled to the output terminal Q of the test register 312, and the output terminal of the inverter 330 is coupled to the input terminal D of the test register 314. If, at a certain moment during the test period, the test register 312 and the test register 314 respectively store the bit values Y1 and Y2, the first test register group 310 will output bit values Y1, Y2, $\overline{Y1}$, and $\overline{Y2}$ in sequence at the subsequent four consecutive triggers. $\overline{Y1}$ and $\overline{Y2}$ are the inverted logics of Y1 and Y2, respectively. In this way, the combination of the first test register group 310 and the inverter 330 can output the write enable signal WE of Table 1, Table 2, or Table 3 (i.e., when Y1=Y2=1). In other words, the circuit of FIG. 3A is the simplified circuit of FIG. 2A, and the simplified circuit is smaller in circuit area.

Reference is made to FIG. 3B. The circuit of FIG. 3B is used to output the test data DI and/or the memory address ADDR. The multiplexer group 370 is coupled between the second test register group 360 and the register 140 and selects the function signal SF or the output of the second test register group 360 according to the mode control signal MSM_MODE. The input terminal of the inverter 380 is coupled to the output terminal Q of the test register 362, and the output terminal of the inverter 380 is coupled to the input terminal D of the test register 362. If, at a certain moment during the test, the test register 362 stores the bit value Z1, the second test register group 360 will output the bit values Z1, $\overline{Z1}$, Z1, and $\overline{Z1}$ in sequence at the subsequent four consecutive triggers. $\overline{Z1}$ is the inverted logic of Z1. In this way, the combination of the second test register group 360 and inverter 380 can output the memory addresses ADDR and/or test data DI of Table 2 or Table 3 (Z=1 for Table 2, and Z=0 for Table 3). In other words, the circuit of FIG. 3B is the simplified circuit of FIG. 2B, and the simplified circuit is smaller in circuit area.

Figure 4A:
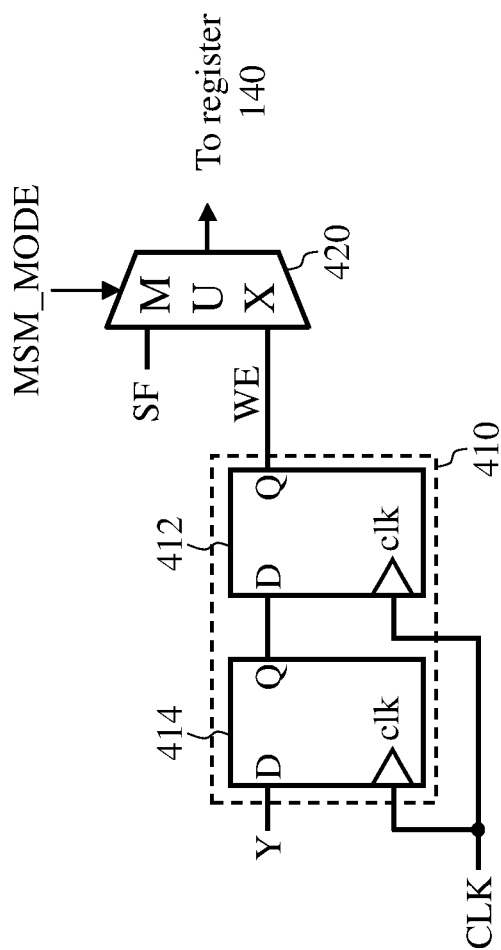
FIGS. 4A and 4B illustrate circuit diagrams of the test circuit according to another embodiment of the present invention.
Figure 4B:
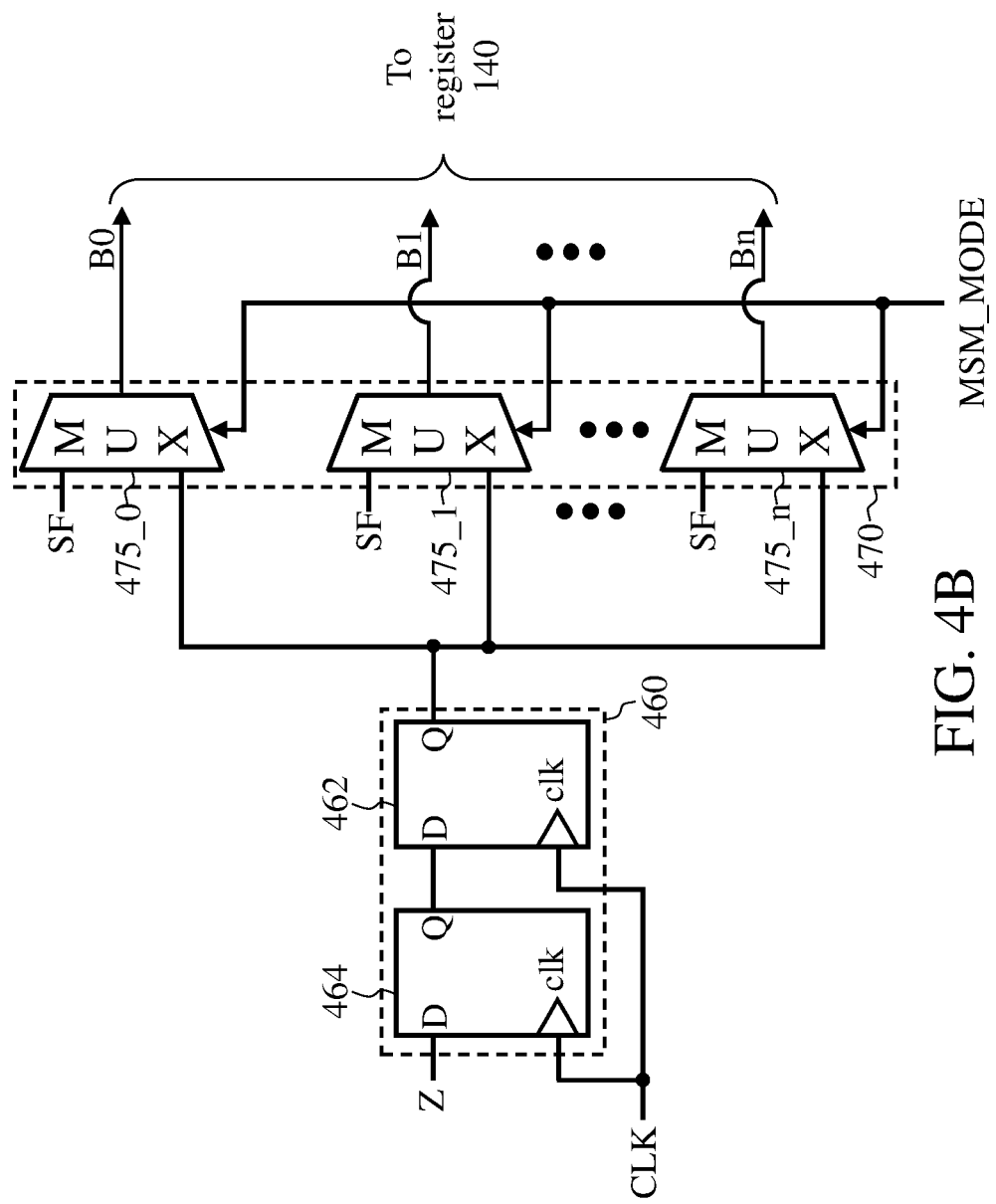

FIGS. 4A and 4B show circuit diagrams of the test circuit according to another embodiment of the present invention. The test circuit is used to test the stuck-at fault on the paths between the memory 160 and the function registers (i.e., the register 140 and the register 170). In the embodiment of FIGS. 4A and 4B, the test circuit 130 includes a first test register group 410, a multiplexer 420, a second test register group 460, and a multiplexer group 470. The first test register group 410 includes a test register 412 and a test register 414. The second test register group 460 includes a test register 462 and a test register 464. The multiplexer group 470 includes n+1 multiplexers 475 (i.e., the multiplexer 475_0, the multiplexer 475_1, ..., and the multiplexer 475_n, n being a positive integer).

Reference is made to FIG. 4A. The circuit of FIG. 4A is used to output the write enable signal WE. The test register 412 is electrically connected to the test register 414. The multiplexer 420 is coupled between the first test register group 410 and the register 140 and selects the function signal SF or the output of the first test register group 410 according to the mode control signal MSM_MODE.

Reference is made to FIG. 4B. The circuit of FIG. 4B is used to output the test data DI and/or the memory address ADDR. The test register 462 is electrically connected to the test register 464. The multiplexer group 470 is coupled between the second test register group 460 and the register 140 and selects the function signal SF or the output of the second test register group 460 according to the mode control signal MSM_MODE.

When the control circuit tests the stuck-at fault on the paths between the memory 160 and the function registers (i.e., the register 140 and the register 170), the write enable signal WE, the test data DI, and the memory address ADDR that are received by the memory 160 are shown in Table 4 below.

TABLE 4

| Period | T1 | T2 |
|---|---|---|
| Operation | Write | Read |
| WE | 1 | 0 |
| ADDR | first address | first address |
| DI | first value | |

In the period T1, the test circuit 130 outputs 1 as the write enable signal WE, outputs the first address as the memory address ADDR, and outputs the first value as the test data DI; that is, the control circuit writes the first value to the first address of the memory 160. In the period T2, the test circuit 130 outputs 0 as the write enable signal WE and outputs the first address as the memory address ADDR; that is, the control circuit reads the data stored in the first address of the memory 160. When there is no stuck-at fault, the data read by the control circuit should present the first value. However, when there is a stuck-at fault, at least one bit of the data read by the control circuit presents an incorrect value. The periods T1 and T2 are two consecutive periods of the clock CLK.

In some embodiments, the contents of the memory address ADDR and the test data DI in Table 4 above are as shown in Table 5 or Table 6 below.

TABLE 5

| Period | T1 | T2 |
|---|---|---|
| Operation | Write | Read |
| WE | 1 | 0 |
| ADDR | 11 . . . 11 (All 1) | 11 . . . 11 (All 1) |
| DI | 11 . . . 11 (All 1) | |

TABLE 6

| Period | T1 | T2 |
|---|---|---|
| Operation | Write | Read |
| WE | 1 | 0 |
| ADDR | 00 . . . 00 (All 0) | 00 . . . 00 (All 0) |
| DI | 00 . . . 00 (All 0) | |

In other words, the first address in Table 4 can be the greatest address (as in Table 5) or the smallest address (as in Table 6) of memory 160, and the first value in Table 4 can be the greatest value of the test data DI (as in Table 5) or the smallest value of the test data DI (as in Table 6).

For the embodiment of Table 5 or Table 6, at a certain moment during the test, the test register 412 and the test register 414 store the bit values Y1 and Y2, respectively, of which the bit value Y1 corresponds to the write operation (e.g., Y1=1), whereas the bit value Y2 corresponds to the read operation (e.g., Y2=0).

For the embodiment of Table 5 or Table 6, at a certain moment during the test, the test register 462 and the test register 464 respectively store the bit values Z1 and Z2, of which the bit value Z1 corresponds to the first address and/or the first value (e.g., Z1=1 (as in Table 5), or Z1=0 (as in Table 6)), and the bit value Z2 corresponds to the first address (e.g., Z2=1 (as in Table 5), or Z2=0 (as in Table 6)). Because the first address is the same as the second address, the bit value Z1 is identical to the bit value Z2.

For the embodiment of Table 5 or Table 6, the circuit of FIG. 4B can be used to output the memory address ADDR and/or the test data DI.

Figure 5A:
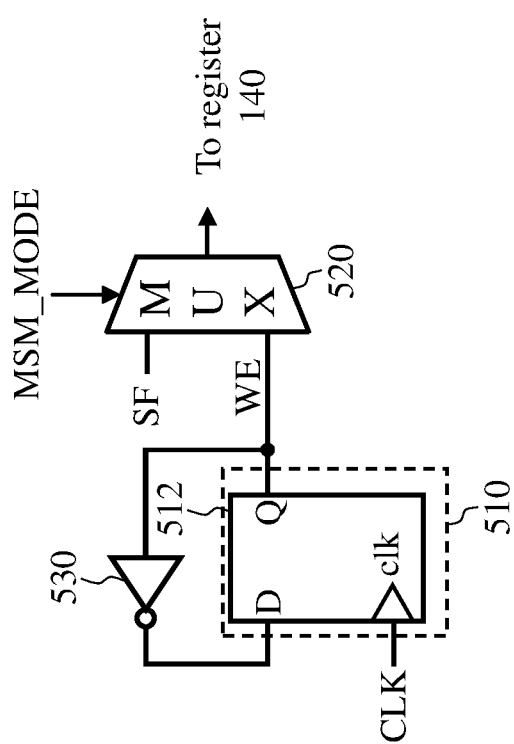
FIGS. 5A and 5B illustrate circuit diagrams of the test circuit according to another embodiment of the present invention.
Figure 5B:
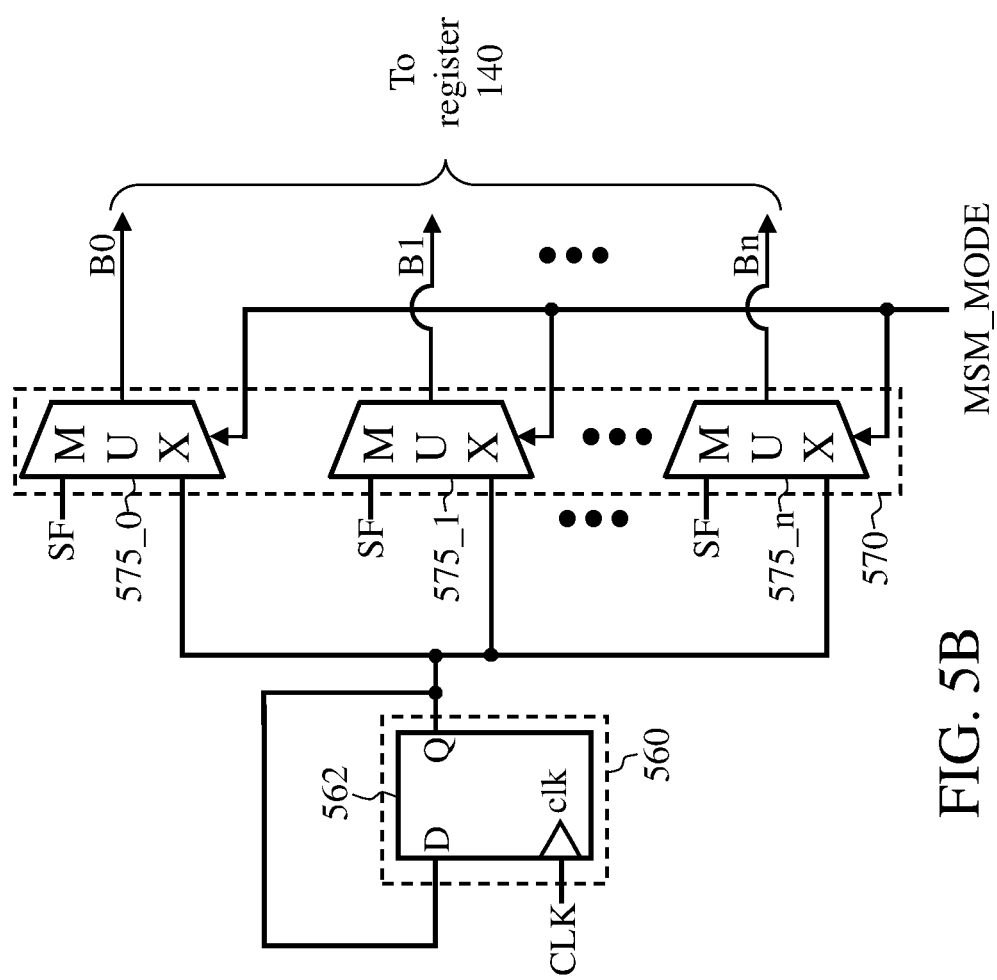

FIGS. 5A and 5B show circuit diagrams of the test circuit according to another embodiment of the present invention. The test circuit is used to test the stuck-at fault on the paths between the memory 160 and the function registers (i.e., the register 140 and the register 170). In the embodiment of FIGS. 5A and 5B, the test circuit 130 includes a first test register group 510, a multiplexer 520, an inverter 530, a second test register group 560, and a multiplexer group 570. The first test register group 510 includes a test register 512. The second test register group 560 includes a test register 562. The multiplexer group 570 includes n+1 multiplexers 575 (i.e., the multiplexer 575_0, the multiplexer 575_1, . . . , and the multiplexer 575_n, n being a positive integer).

Reference is made to FIG. 5A. The circuit of FIG. 5A is used to output the write enable signal WE. The multiplexer 520 is coupled between the first test register group 510 and the register 140 and selects the function signal SF or the output of the first test register group 510 according to the mode control signal MSM_MODE. The input terminal of the inverter 530 is coupled to the output terminal Q of the test register 512, and the output terminal of the inverter 530 is coupled to the input terminal D of the test register 512. The circuit of FIG. 5A is the simplified circuit of FIG. 4A, and the simplified circuit is smaller in circuit area.

Reference is made to FIG. 5B. The circuit of FIG. 5B is used to output the test data DI and/or the memory address ADDR. The multiplexer group 570 is coupled between the second test register group 560 and the register 140 and selects the function signal SF or the output of the second test register group 560 according to the mode control signal MSM_MODE. The circuit of FIG. 5B is the simplified circuit of FIG. 4B, and the simplified circuit is smaller in circuit area.

The test circuit of the present invention is quite simple. Since the test signals (including the write enable signal WE, the memory address ADDR, and the test data DI) that the test circuit provides to the memory do not pass through the logic circuit, the test circuit of the present invention has the following advantages: low test vector complexity, high control over the memory, fast generation of the test vectors, simple test vectors, and high test coverage.

The shape, size, and ratio of any element in the disclosed figures are exemplary for understanding, not for limiting the scope of this invention.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A test circuit for testing a memory, an input of the memory being coupled to a register, and the register being coupled to a logic circuit, the test circuit comprising:
   a first test register group, comprising at least one test register;
   a second test register group, comprising at least one test register;
   a first multiplexer, coupled between the first test register group and the register; and
   a plurality of second multiplexers, coupled between the second test register group and the register;
   wherein the first test register group comprises a first test register, a second test register, a third test register, and a fourth test register that are electrically connected in sequence, and an output of the third test register is an input of the second test register; and
   wherein the first test register, the second test register, the third test register, and the fourth test register store a first bit value, a second bit value, a third bit value, and a fourth bit value, respectively, the first bit value and the second bit value correspond to a write operation of the memory, and the third bit value and the fourth bit value correspond to a read operation of the memory.

2. The test circuit of claim 1, wherein the second multiplexers output identical bit values.

3. The test circuit of claim 1, wherein the second test register group comprises a fifth test register, a sixth test register, a seventh test register, and an eighth test register that are electrically connected in sequence.

4. The test circuit of claim 3, wherein the fifth test register, the sixth test register, the seventh test register, and the eighth test register store a fifth bit value, a sixth bit value, a seventh bit value, and an eighth bit value, respectively, the fifth bit value is different from the sixth bit value, and the seventh bit value is different from the eighth bit value.

5. The test circuit of claim 1, wherein the second test register group comprises a first test register and a second test register that are electrically connected in sequence.

6. The test circuit of claim 5, wherein the first test register and the second test register store a first bit value and a second bit value, respectively, and the first bit value is identical to the second bit value.

* * * * *